United States Patent [19]
Brickell et al.

[11] Patent Number: 5,466,945
[45] Date of Patent: Nov. 14, 1995

[54] APPARATUS FOR DETECTING PROPER POSITIONING OF OBJECTS IN A HOLDER

[75] Inventors: Christopher G. Brickell, Mukilteo; Kenneth A. Langland, Seattle, both of Wash.

[73] Assignee: Eaton Corporation, Cleveland, Ohio

[21] Appl. No.: 216,748

[22] Filed: Mar. 23, 1994

[51] Int. Cl.⁶ .................................................. G01N 21/86
[52] U.S. Cl. ............................... 250/559.12; 250/559.43; 414/935
[58] Field of Search ...................... 250/561, 223 R, 250/222.1, 221, 559.43, 559.12; 414/936, 937, 938, 939, 331, 935

[56] References Cited

U.S. PATENT DOCUMENTS

| | | | |
|---|---|---|---|
| 4,786,816 | 11/1988 | Ohmori et al. | 250/561 |
| 4,803,373 | 2/1989 | Imamura et al. | 250/561 |
| 4,954,721 | 9/1990 | Suzuki | 250/561 |
| 5,003,188 | 3/1991 | Igari | 250/561 |
| 5,225,691 | 7/1993 | Powers et al. | 250/561 |
| 5,308,993 | 5/1994 | Holman et al. | 250/561 |
| 5,319,216 | 6/1994 | Mokuo et al. | 250/561 |

*Primary Examiner*—Edward P. Westin
*Assistant Examiner*—Steven L. Nichols
*Attorney, Agent, or Firm*—Quarles & Brady

[57] ABSTRACT

The positions of objects in a holder, such as a cassette containing semiconductor wafers, are determined by a system that projects a pair of coplanar light beams through the cassette from one side. A reflector on the opposite side reflects both light beams back though the cassette and onto separate photodetectors on the one side. A computer analyzes signals from the photodetectors as the cassette is moved through the light beams. As the cassette moves the light beams are interrupted by the wafers. The relative widths and timing of pulses in the signals indicate the location of wafers in the cassette and whether a wafer is misaligned.

20 Claims, 2 Drawing Sheets

FIG. 4A OUT A

FIG. 4B OUT B

APPARATUS FOR DETECTING PROPER POSITIONING OF OBJECTS IN A HOLDER

BACKGROUND OF THE INVENTION

The present invention relates to determining whether a plurality of objects have been properly placed in a holding device, and particularly to such apparatus which optically inspects placement of the objects.

During semiconductor fabrication, wafers of silicon are held in a cassette between processing steps. The cassette typically is a frame with a plurality of horizontal slots, each of which receives a silicon wafer. A handling mechanism within the fabrication system individually removes each wafer from the cassette for processing and returns it to the cassette after processing.

Because of the automated handling of the wafers, it is necessary to inspect the cassette to insure that all of the wafers are properly placed into the slots of the cassette. Due to placement inaccuracies or non-uniformity among the wafers, such as chipped and flat edges, the wafer may fall out of its slot and fall onto the wafer immediately below in the cassette. Alternatively, one side of the wafer may be misplaced or drop out of its slot while the opposite side remains in the slot so that the wafer is slanted in the cassette. Improperly located wafers can be damaged by the wafer handling device and result in damage to other wafers.

Previous semiconductor wafer processing equipment had optical systems for detecting wafers which were misaligned within the cassette. Typically, the optical systems had a light source on one side of the cassette to transmit the light beam through the cassette and had a detector on the opposite side that responded to the transmission of light. The wafers blocked the light beam, enabling the presence of a wafer to be detected. Some systems had several of these emitter-detector pairs which sent a plurality of light beams through the cassette. Such detection systems were difficult to incorporate into the semiconductor processing equipment since they required individual windows on each side of the equipment so that the light could pass therethrough. In addition, wires had to be run around the processing equipment between the light source and detector which often may be difficult depending upon the physical installation of the equipment.

SUMMARY OF THE INVENTION

The positions of objects in a holder, such as semiconductor wafers in a cassette, are inspected by an apparatus which projects two light beams (IR or Visible) through the cassette at different angles. The holder and apparatus are moved relative to each other so that the light beams are broken by the objects. Signals produced by photodetectors that sense the light beams indicate the relative positioning of objects within the holder and whether the objects are properly positioned. The apparatus includes a first emitter located on one side of the holder to produce a first light beam directed through the holder. A reflector located on the second side of the holder reflects the first light beam back through the holder and after emerging again from the holder the first light beam strikes a first detector. The first detector is located on the same side of the holder as the first emitter and produces a first signal that indicates the intensity of the light striking the detector.

A mechanism is provided to scan the objects in the holder with the first light beam. For example, this mechanism is a device that moves the holder with respect to the first emitter and the first detector. As the holder moves, the light beams are interrupted by the objects which produce pulses in the signal from the detector. An electronic circuit receives and analyzes the detector signal and produces an indication of positioning of the objects in the holder.

In the preferred embodiment of the apparatus a second emitter-detector pair send and detect a second light beam traveling through the holder along a path that is different from the path of the first light beam. By analyzing signals from the two detectors, the electronic circuit is able to determine if an object is tilted within the holder from the nominal position.

A general object of the present invention is to provide a system for detecting the position of objects in a holder wherein all of the active components of the system are located on the same side of the holder. This orientation of components eliminates the need to run wires around the holder.

BRIEF DESCRIPTION OF THE DRAWINGS

FIGS. 4A and 4B are the output signals produced by the circuit in FIG. 3.

DETAILED DESCRIPTION OF THE INVENTION

Figure 1:
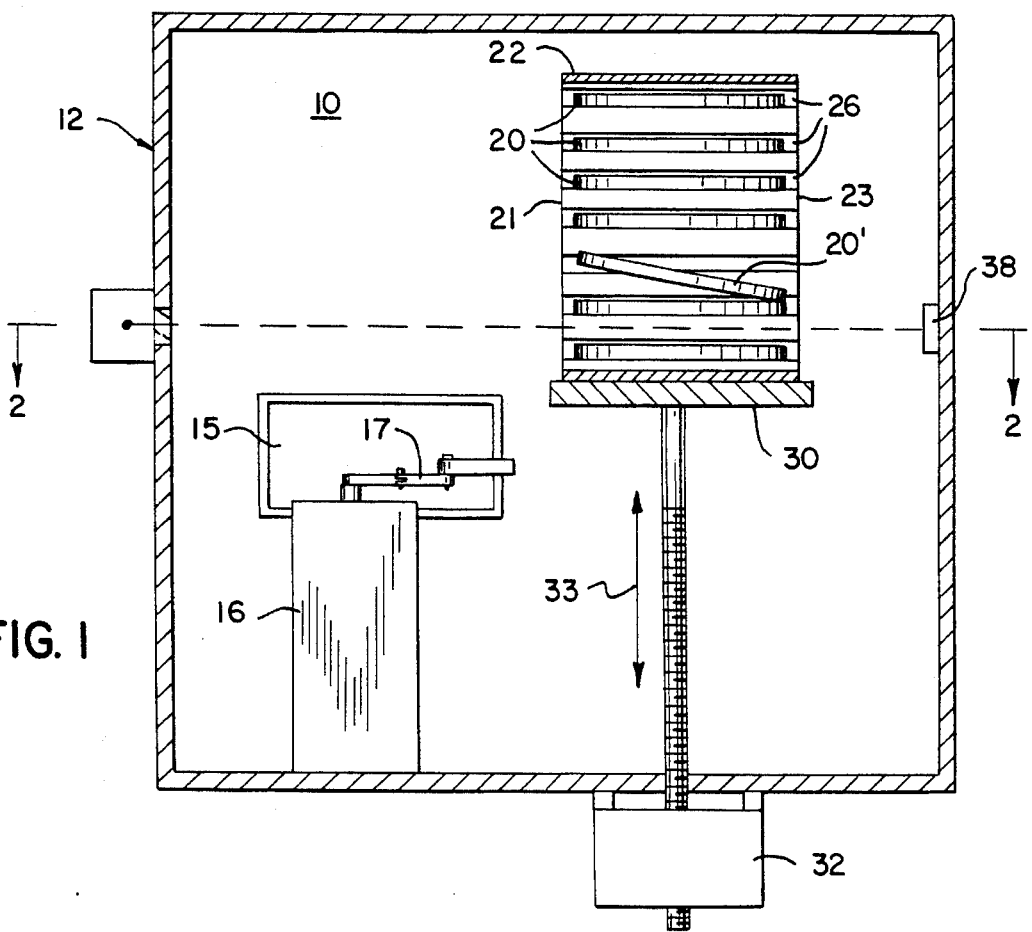
FIG. 1 is a cross section through a semiconductor processing apparatus which incorporates the present invention.
Figure 2:
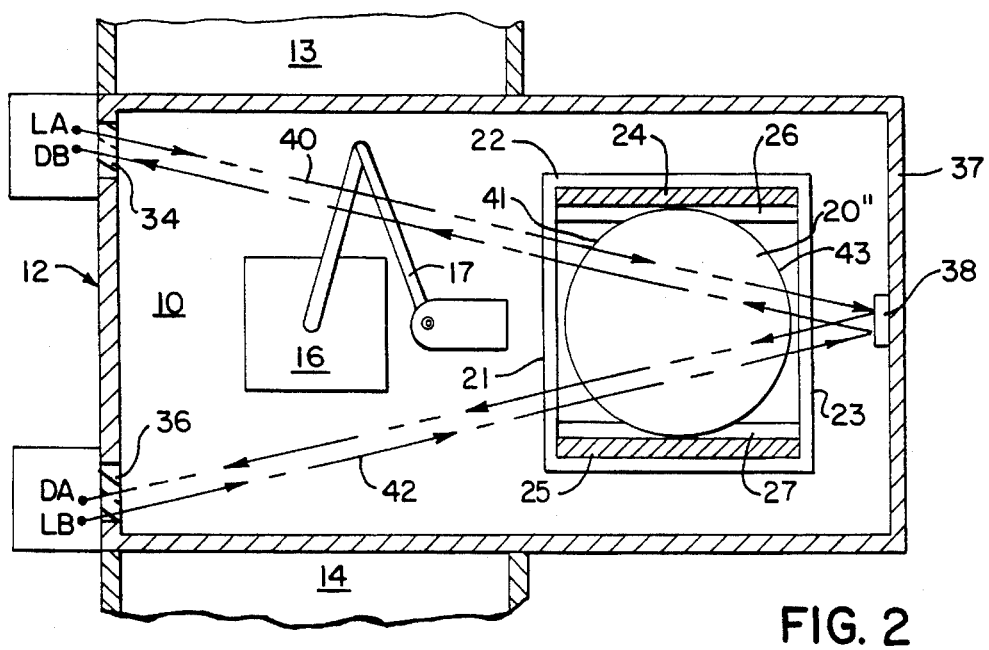
FIG. 2 is a cross section view taken along lines 2—2 of FIG. 1.

FIGS. 1 and 2 show a handling chamber 10 of a semiconductor wafer processing system 12 which has other chambers 13 and 14 connected to handling chamber 10 by doors, such as door 15. A robotic device 16 is provided to transport semiconductor wafers among the various chambers.

A plurality of wafers 20 are stored parallel to each other within a cassette 22 in the handling chamber 10. The cassette 22 is of conventional design and has side walls with opposing horizontal grooves 26 and 27 in their interior surfaces. Each pair of opposing parallel grooves in the side walls provide a slot for receiving a wafer. The front side 21 and back side 23 of the cassette are open, allowing the wafers to be inserted and removed from the slots.

Ideally when a circular wafer 20 is placed into the cassette, it is slid horizontally into grooves 26 and 27 in opposite side walls 24 and 25 of the cassette 22. The engagement with the grooves holds the wafer 20 in a horizontal position. However, in reality, the wafers have notches in their edges and even flattened edges which affect the ability of the wafer to properly engage within the grooves of the cassette. For example, as shown in FIG. 1, wafer 20' is tilted within the cassette. Other problems may occur with respect to the placement of the wafers within the cassette. For instance, multiple wafers may be inserted into a given slot or an empty slot may be present. It is important to know whether any of these conditions occurs so that the robotic device 16 can properly handle the wafers and avoid damaging them.

The cassette 22 is placed on a platform 30 which is moved vertically within the handling chamber 10 by a drive mechanism 32 as indicated by arrows 33. Similar drive mechanisms have been used in previous wafer handling processing systems to vertically orient the different wafers 20 with the arm 17 of the robotic device 16.

Referring still to FIGS. 1 and 2, an optical inspection apparatus is incorporated into the semiconductor wafer processing system 12 to inspect the cassette 22 and determine whether wafers are properly positioned in the slots. A pair of windows 34 and 36 are located in a front wall of the handling chamber 10. A laser LA and a photodetector DB are positioned outside the first window 34. Another laser LB and another photodetector DA are positioned outside the second window 36. The lasers and detectors are aimed at a reflector 38 mounted on the back wall inside the handling chamber 10. The photodetectors DA and DB are focused with a field of view to sense the light being reflected from reflector 38. The field of view of the detector is significantly larger than the thickness of the wafer and thus the precision of the detector aim is not critical. Alternatively, a separate reflector 38 can be eliminated if the rear wall 37 of the wafer handling chamber 10 has an adequate reflectivity, thus acting as a reflector. The reflector 38 may be mounted outside a window in the opposite wall 37 of the handling chamber 10.

Laser LA transmits a first beam of infrared or visible light 40 which is focused on the edge 41 at the front of wafer 20" as shown in FIG. 2. If the first light beam 40 does not strike the wafer, it is reflected by reflector 38 and is detected by photodetector DA. Similarly, laser LB transmits a second beam of infrared or visible light 42 which is focused at the edge 41 of wafer 20. Unless it strikes a wafer, the second light beam 42 passes through the cassettes to the reflector 38 and is reflected through the cassette again to photodetector DB. Both of the lasers LA and LB produce beams of light which are focused on the edge 41 of the wafers 20. Thus, a wafer within cassette 22 will break the beams of light as the cassette moves vertically within handling chamber 10. The present invention may use other types of light sources which produce relatively thin light beams focused on the edge 41 of the wafers 20.

The paths of the first and second light beams 40 and 42 lie in a common horizontal plane which is parallel to the planes of the wafers 20 within the cassette 22 and orthogonal to the direction 33 of wafer movement. The light beam paths also do not pass through the center of the circular wafers 20 so that the light beams 40 and 42 will not strike perpendicular to the edge 41 of the wafers 20. If the wafer 20 is transparent, such as a substrate used in liquid crystal displays, most of the light will be reflected and/or refracted by the edge 41 of the wafer 20. As a consequence, a significant amount of light will not be transmitted through a transparent wafer to the reflector 38, giving consideration to refraction and internal reflection within the wafer.

Figure 3:
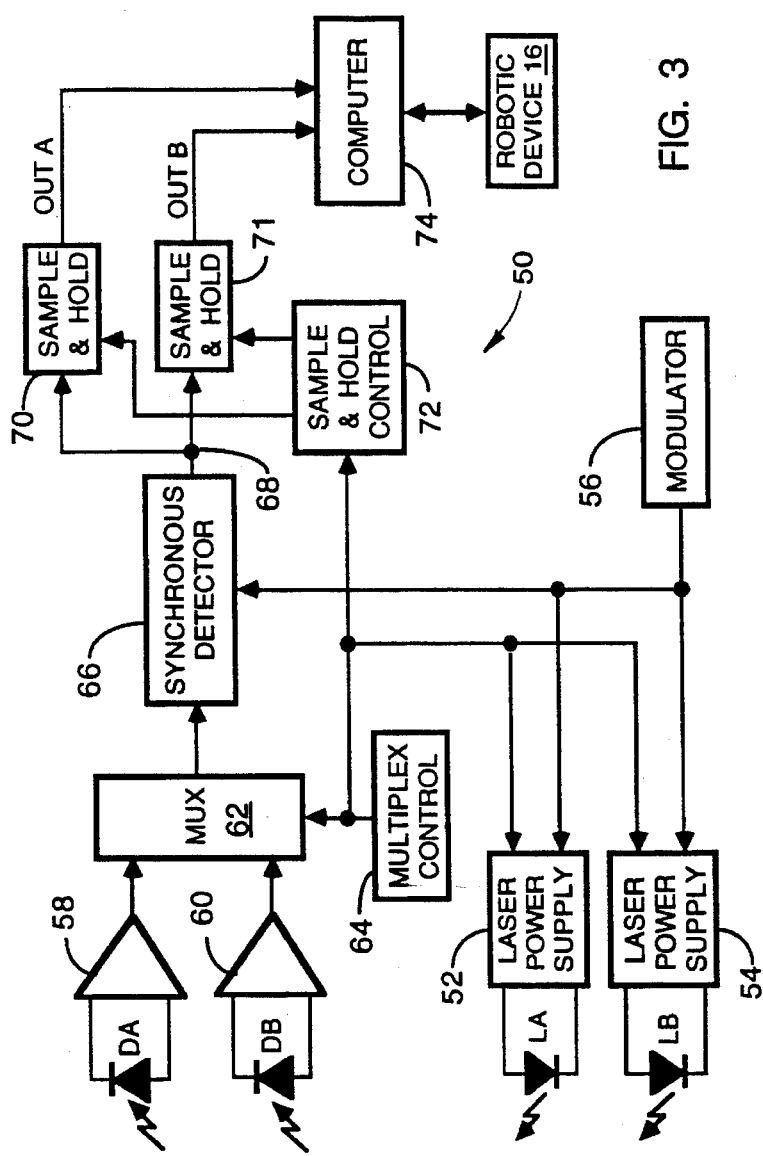
FIG. 3 is a block schematic diagram of the system for optically detecting the position of semiconductor wafers within the apparatus in FIG. 1.

To ensure that cross coupling does not occur between each laser-photodetector pair (LA-DA and LB-DB), the pairs may be time multiplexed so that only one pair is operational at any instant of time. FIG. 3 illustrates the circuitry for controlling the operation of the lasers and detectors. Each laser LA and LB, which typically is a diode-type laser, is driven by a separate power supply 52 and 54, respectively. The outputs from power supplies 52 and 54 are modulated by a signal from modulator 56.

The two photodiodes DA and DB are connected by preamplifiers 58 and 60, respectively, to a two-to-one multiplexer 62. The multiplexer 62 responds to a signal from multiplex control 64 by selecting the output signal from one of the preamplifiers 58 or 60 to apply to a synchronous detector 66. The multiplex control signal also selectively activates the corresponding laser power supply 52 or 54.

The synchronous detector 66 also receives the output from the modulator 56 to produce an analog output signal on line 68 that indicates the magnitude of the received light from the active laser LA or LB, which has been detected by the selected detector DA or DB. The output of the synchronous detector 66 is applied to first and second sample and hold circuits 70 and 71 which are operated by a sample and hold circuit 72 in response to the signal from the multiplex control 64. The first sample and hold circuit 70 stores a signal level that is produced from the light detected by photodetector DA, and the second sample and hold circuit 71 stores a signal level representative of the light sensed by photodetector DB. The output signals from the two sample and hold circuits 70 and 71 are designated OUT A and OUT B and are connected for example to a computer 74 which analyzes the signals to determine the orientation of the wafers 20 within the cassette 22.

Prior to inspection of the wafers 20 within the cassette 22, the platform 30 is placed at one extreme end of its travel to either fully raise or fully lower the cassette. The drive mechanism 32 then begins to move the platform and cassette 22 slowly to the other end of the platform's travel. The drive mechanism 32 moving the cassette relative to the light beams 40 and 42 enables the beams to scan the wafers in the cassette. Alternatively, the scanning can be accomplished by moving the lasers and photodetectors and maintaining the cassette stationary.

While this movement is occurring, the optical circuit 50 is energized. The multiplex control 64 alternately activates each of the two laser-photodetector pairs LA-DA and LB-DB. For example, one state of the control signal from multiplex control 64 turns on laser power supply 52, thereby producing a modulated beam 40 from laser LA. Assuming that a wafer 20 does not block that beam 40, the beam is reflected by reflector 38 and strikes the corresponding photodetector DA, producing an output signal from preamplifier 58. Multiplexer 62 has responded to the signal from the multiplex control 64 by coupling the output signal from preamplifier 58 to the synchronous detector 66. In addition, the signal from the multiplex control 64 causes the sample and hold control circuit 72 to reset the first sample and hold circuit 70 to store the signal level being produced by the synchronous detector 66. At this time, the second sample and hold circuit 71 is holding a previously stored value and is unaffected by the signal output from the synchronous detector 66.

When the signal from the multiplex control 64 changes states, the second laser power supply 54 is energized to produce a beam 42 from laser diode LB. At that time, the multiplexer 62 couples the signal from the photodetector DB and preamplifier 60 to the synchronous detector 66, disconnecting the signal from preamplifier 58. Laser power supply 52 is deactivated by the multiplex control signal. The second sample and hold circuit 72 responds to the change in the multiplex control signal by deactivating the first sample and hold circuit 70 and activating the second sample and hold circuit 72 to store the signal level corresponding to the light received by photodetector DB.

As the cassette 22 moves vertically, the wafers 20 occlude the light beams 40 and 42 casting a shadow on the reflector 38. Thus, the presence of a wafer is detected by the loss of light being received by the photodetectors DA and DB. Since the light beams are focused on the edge 41 at the front of the wafer, a complete loss of light occurs when the focused spot falls on the wafer edge. If the speed of the cassette movement is known, for example a constant speed, the duration of the loss of light is a function of the thickness of the wafer. For example, the longer that the light is loss, the thicker the wafer. Thus the computer is able to measure the thickness of each wafer 20 in the cassette. Also because the cassette 22 is moved at a known speed, the timing of the output signals from the sample and hold circuit 70 and 71 signify the position of each wafer relative to the starting position of the cassette movement and the cassette slots.

With reference to FIGS. 4A and 4B, as the cassette moves through the light beams 40 and 42, the levels of the signals out A and out B from the sample and hold circuit 70 and 71 change. For example, two relatively narrow pulses 81 and 82 occurring simultaneously in the two signals indicate that a wafer is properly aligned within the grooves of the cassette 22.

Relatively wide pulses 83 and 84 indicate either a wafer that is tilted front to back within the cassette 22 (e.g. wafer 20') or one wafer lying on the top of another wafer. Provided the image cast on the reflector by the laser LA or LB, and the field of view of the photodetectors DA and DB are sufficiently small, the front to back slope of the wafer may affect the shape of the pulse. If the wafer is sloped in that manner, the pulse shape may change relatively fast as the front edge 41 of the wafer enters or leaves the light beam. As the back edge 43 of the wafer 20 enters or leaves the light beam, the pulse shape may change relatively slowly. Thus from the relative shape of the leading and trailing edges of the pulse, the slope of the wafer can be determined.

Two relatively short pulses 85 and 86, or 87 and 88, which do not occur simultaneously in the OUT A and OUT B signals indicate that the wafer is tilted from one side wall 24 to the other 25 within cassette 22. The order of occurrence of these non-coincident pulses in signals OUT A and OUT B indicates the direction of the tilt within the cassette.

As previously stated, the known rate of movement of the cassette results in the wafer slot locations passing through the beams at particular intervals. Therefore, pulses should occur in the OUT A and OUT B signals at particular intervals if a wafer is positioned in each slot of the cassette 22. If the computer 74 fails to detect a signal pulse at this particular occurring interval, as indicated by the dotted pulses 89 and 90, then a determination is made that a wafer is not located in that slot of the cassette.

The present optical sensing mechanism has the advantage over previous systems in that the electrical components are mounted on the same side of the wafer handling apparatus and wires do not have to be run from one side to the other.

Furthermore, the present system's computer 74 is able to analyze the OUT A and OUT B signals and determine whether or not a wafer is positioned in each slot of the cassette. A determination can also be made whether a wafer in a given slot is tilted and the orientation of that tilt.

We claim:

1. A system for detecting positions of a plurality of objects in a holder having first and second opposite sides, which apparatus comprises:

a first emitter located on the first side of the holder to produce a first radiation beam directed through the holder;

a reflector located on the second side of the holder to at least partially reflect the first radiation beam back through the holder, wherein reflection by said reflector imparts a V-shape to a path of the first radiation beam;

a first detector located on the first side of the holder for receiving the first radiation beam after reflection by said reflector and producing a first signal that indicates an intensity of radiation which strikes said detector;

a mechanism for scanning the plurality of objects in the holder with the first radiation beam; and an electronic circuit receiving the first signal from said detector and in response thereto producing an indication of whether the objects are properly positioned in the holder.

2. The system recited in claim 1 further comprising:

a second emitter located on the first side of the holder to produce a second radiation beam directed through the holder; and a second detector on the first side of the holder for receiving the second radiation beam after reflection by said reflector, and producing a second signal that indicates an intensity of radiation striking said second detector.

3. The system as recited in claim 2 wherein said first and second emitters produce beams of light at a wavelength selected from the infrared and visible light spectrums.

4. The system as recited in claim 2 wherein said first and second emitters are located so that the first and second radiation beams travel in coplanar paths through the holder.

5. The system as recited in claim 4 wherein said mechanism moves the holder in a direction that is orthogonal to a plane defined by the paths of the first and second light beams.

6. The system as recited in claim 2 wherein said electronic circuit comprises a multiplex circuit that alternately activates said first and second emitters and alternately samples the first and second signals.

7. The system as recited in claim 2 wherein said electronic circuit comprises a multiplex control which produces a control signal that alternately activates said first and second emitters to produce the first and second radiation beams.

8. The system as recited in claim 2 wherein said electronic circuit further comprises:

a modulator connected to said first and second emitters for modulating the first and second radiation beams;

a multiplexer with two inputs that receive the first and second signals and alternately connects the inputs to an output in response to a signal at a control input;

a multiplex control which produces a control signal that is connected to the control input of said multiplexer to alternately connect the two inputs to the output;

a synchronous detector connected to the output of said multiplexer and said modulator and having an output terminal;

first and second sample and hold circuits connected to the output terminal of said synchronous detector, and being controlled by the control signal from said multiplex control wherein said first sample and hold circuit stores a signal level from said synchronous detector that is produced by the first signal from said first detector, and wherein said second sample and hold circuit stores another signal level from said synchronous detector that is produced by the second signal from said second detector.

9. The system as recited in claim 8 wherein said electronic circuit further comprises a computer connected to said first and second sample and hold circuits, and analyzing signal levels stored in said first and second sample and hold circuits to produce the indication of positions of the plurality of objects in the holder.

10. The system as recited in claim 1 wherein said electronic circuit further comprises a means for measuring thickness of a wafer in response to the first signal.

11. The system as recited in claim 1 wherein the path of the first radiation beam having the V-shape lies in a plane that is parallel to planes in which the objects are located in the holder.

12. An apparatus for detecting positions of semiconductor wafers in a holder having first and second opposite sides, which apparatus comprises:

a reflector located on the first side of the holder;

a first emitter located on the second side of the holder for producing a first light beam that is directed through the holder to said reflector which directs the first light beam back through the holder;

a second emitter located on the second side of the holder for producing a second light beam that is directed through the holder to said reflector which directs the second light beam back through the holder;

a first detector located on the second side of the holder for receiving the first light beam after reflection by said reflector, and producing a first signal that indicates an intensity of light striking said first detector;

a second detector located on the second side of the holder for receiving the first light beam after reflection by said reflector, and producing a second signal that indicates an intensity of light striking said second detector;

a mechanism for moving the holder in a direction that is transverse to paths of the first and second light beams, wherein neither of the first and second light beams intersects a center of a wafer as the holder moves; and an electronic circuit connect to said first and second detectors and, in response to the first and second signals, producing an indication of whether the semiconductor wafers are properly positioned in the holder.

13. The apparatus as recited in claim 11 wherein said first and second emitters are located so that the first and second light beams travel in coplanar paths through the holder.

14. The apparatus as recited in claim 11 wherein said first and second emitters are located so that the first and second light beams travel in a common plane that is parallel to planes in which the wafers are located in the holder.

15. The system as recited in claim 11 wherein the first and second light beams are focussed on an edge of the wafer.

16. The apparatus as recited in claim 11 wherein said electronic circuit comprises:

a modulator connected to said first and second emitters for modulating the first and second light beams;

a multiplexer having two inputs for receiving the first and second signals and selectively connecting one of the two inputs to and output in response to a signal received at a control input;

a multiplex control which produces a control signal that is connected to the control input of said multiplexer to alternately connect the two inputs to the output;

a synchronous detector connected to the output of said multiplexer and said modulator and having an output terminal;

first and second sample and hold circuits connected to the output terminal of said synchronous detector, and being controlled by the control signal from said multiplex control wherein said first sample and hold circuit stores a signal level from said synchronous detector that is produced by the first signal from said first detector, and wherein said second sample and hold circuit stores another signal level from said synchronous detector that is produced by the second signal from said second detector; and a computer connected to said first and second sample and hold circuits, and analyzes stored signal levels to produce the indication of positioning of the semiconductor wafers in the holder.

17. An method for inspecting positioning of a plurality of objects in a holder having first and second opposite sides, steps of said method comprising:

transmitting a first light beam through the holder from the first side to the second side;

reflecting the first light beam back through the holder from the second side to the first side, wherein the first light beam travels in a V-shaped path through the holder;

detecting an intensity of the first light beam emerging from the first side of the cassette transmitting a second light beam through the holder from the first side to the second side;

reflecting the second light beam back through the holder from the second side to the first side, wherein the second light beam travels in a V-shaped path through the holder;

detecting an intensity of the second light beam emerging from the first side of the cassette scanning the holder with the first and second light beams; and determining, from variations in the intensity of the first and second light beams as the holder is scanned, a position of each object in the holder.

18. The method recited in claim 17 wherein the paths of the first and second light beams lie in a common plane.

19. A system for detecting positions of a plurality of objects in a holder, which apparatus comprises:

a first emitter located on one side of the holder to produce a first radiation beam directed into the holder;

a first detector located on the one side of the holder for receiving the first radiation beam after reflection in a V-shaped path through the holder and said first detector producing a first signal that indicates an intensity of radiation which strikes said detector;

a mechanism for scanning the plurality of objects in the holder with the first radiation beam; and an electronic circuit receiving the first signal from said detector and in response thereto producing an indication of whether the objects are properly positioned in the holder.

20. The system recited in claim 19 further comprising:

a second emitter located on the one side of the holder to produce a second radiation beam directed into the holder; and a second detector on the first side of the holder for receiving the second radiation beam after reflection through the holder, and said second detector producing a second signal that indicates an intensity of radiation striking said second detector.

* * * * *